(12) United States Patent
Sohn et al.

(10) Patent No.: US 10,333,054 B2
(45) Date of Patent: Jun. 25, 2019

(54) NANOGENERATOR AND METHOD OF MANUFACTURING THE SAME

(71) Applicant: SAMSUNG ELECTRONICS CO., LTD., Suwon-si (KR)

(72) Inventors: Jung-inn Sohn, Hwaseong-si (KR); Seung-nam Cha, Seoul (KR); Sung-min Kim, Seoul (KR); Sang-woo Kim, Suwon-si (KR); Ju-seok Seo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 713 days.

(21) Appl. No.: 15/015,948

(22) Filed: Feb. 4, 2016

(65) Prior Publication Data

US 2016/0155930 A1    Jun. 2, 2016

Related U.S. Application Data

(62) Division of application No. 13/412,285, filed on Mar. 5, 2012, now Pat. No. 9,270,207.

(30) Foreign Application Priority Data

Aug. 10, 2011    (KR) .................. 10-2011-0079717

(51) Int. Cl.
*H01L 41/04*    (2006.01)
*H02N 2/18*    (2006.01)
(Continued)

(52) U.S. Cl.
CPC .......... *H01L 41/45* (2013.01); *H01L 41/1136* (2013.01); *H01L 41/193* (2013.01);
(Continued)

(58) Field of Classification Search
CPC ... H01L 41/45; H01L 41/1136; H01L 41/193; H02N 2/18; H02N 11/002
(Continued)

(56) References Cited

U.S. PATENT DOCUMENTS 8,716,920 B2 *    5/2014    Kim ..................... H02N 2/18
                                                310/328
9,270,207 B2 *    2/2016    Sohn ..................... H01L 41/45
(Continued)

FOREIGN PATENT DOCUMENTS

EP    2495777 A2    9/2012
JP    2005-118936 A    5/2005
(Continued)

OTHER PUBLICATIONS

Communication dated Feb. 23, 2017 issued by Korean Intellectual Property Office in counterpart Korean Application No. 10-2011-0079717.
(Continued)

*Primary Examiner* — Thomas M Dougherty
(74) *Attorney, Agent, or Firm* — Sughrue Mion, PLLC

(57)    ABSTRACT

A nanogenerator with at least one nanostructure and method of manufacturing the same are provided. The method of manufacturing the nanogenerator includes forming at least one nanostructure including an organic piezoelectric material on a substrate.

14 Claims, 8 Drawing Sheets

(51) Int. Cl.
  *H01L 41/113* (2006.01)
  *H01L 41/22* (2013.01)
  *H01L 41/45* (2013.01)
  *H01L 41/193* (2006.01)
  *H02N 11/00* (2006.01)

(52) U.S. Cl.
  CPC ............. *H02N 2/18* (2013.01); *H02N 11/002* (2013.01); *Y10T 29/42* (2015.01)

(58) Field of Classification Search
  USPC .......................................... 310/339; 29/25.35
  See application file for complete search history.

(56) References Cited

U.S. PATENT DOCUMENTS

| | | | |
|---|---|---|---|
| 2009/0152873 A1* | 6/2009 | Gangopadhyay | ....... C06B 45/14 290/1 R |
| 2010/0060109 A1 | 3/2010 | Russell et al. | |
| 2010/0117488 A1 | 5/2010 | Wang et al. | |
| 2010/0141095 A1 | 6/2010 | Park | |
| 2011/0101315 A1* | 5/2011 | Choi | ....... B82Y 10/00 257/40 |
| 2011/0107569 A1 | 5/2011 | Wang et al. | |
| 2011/0204317 A1* | 8/2011 | Park | ....... B82Y 30/00 257/9 |
| 2012/0049692 A1 | 3/2012 | Boyd et al. | |
| 2012/0049696 A1* | 3/2012 | Cha | ....... H01L 41/183 310/367 |

FOREIGN PATENT DOCUMENTS

| | | |
|---|---|---|
| JP | 2009-123336 A | 6/2009 |
| JP | 2010-135741 A | 6/2010 |
| KR | 10-2008-0017606 A | 2/2008 |
| KR | 10-2011-0047860 A | 5/2009 |
| KR | 10-0925775 B1 | 11/2009 |
| KR | 10-2010-0062729 A | 6/2010 |
| KR | 10-2011-0021637 A | 3/2011 |
| KR | 10-1023446 B1 | 3/2011 |
| KR | 10-2011-0040254 A | 4/2011 |
| WO | 2008-000045 A1 | 1/2008 |
| WO | 2008-124084 A2 | 10/2008 |
| WO | 2010-022158 A2 | 2/2010 |

OTHER PUBLICATIONS

Communication from the European Patent Office dated May 15, 2014 in a counterpart European Application No. 12175504.5.
Seongeun Lee et al., "Effects of Various Solution Wetting Conditions on the Morphology and the Crystallization of Poly (Vinylidene Fluoride) Nanotubes", Journal of the Korean Physical Society, vol. 54, No. 3, Mar. 2009, pp. 1198-1202.

* cited by examiner

NANOGENERATOR AND METHOD OF MANUFACTURING THE SAME

CROSS-REFERENCE TO RELATED APPLICATION

This application is a divisional of U.S. patent application Ser. No. 13/412,285, filed Mar. 5, 2012, and claims priority from Korean Patent Application No. 10-2011-0079717, filed on Aug. 10, 2011 in the Korean Intellectual Property Office, the disclosures of each of which are incorporated herein in their entirety by reference.

BACKGROUND

1. Field

The present disclosure relates to nanogenerators and methods of manufacturing the same, and more particularly, to a nanogenerator with a nanostructure including an organic piezoelectric material and a method of manufacturing the same.

2. Description of the Related Art

Recently, much attention has been paid to energy harvesting technologies. Among energy harvesting devices, an energy generator using piezoelectric characteristics is a new type of environment-friendly energy generator. An energy generator converts mechanical energy, generated, e.g., from fine vibrations or the motion of a human body in an ordinary living environment, into electrical energy, unlike generators such as solar cells, wind power generators, and fuel cells. Furthermore, with recent advances in nano technology, it is possible to easily manufacture nano-sized devices. However, the batteries that are generally used as power supply sources for the nano-sized devices are not only far bulkier than the nano devices, but they also have a limited lifetime. Accordingly, the use of batteries may degrade the performance of a nano device and prevent the nano device from being independently driven.

To solve such problems, nanogenerators that use a nano-sized piezoelectric material have been developed. However, in general, nanogenerators using piezoelectric characteristics are manufactured using a zinc oxide (ZnO) piezoelectric material, and thus they have low energy efficiency.

SUMMARY

According to an aspect of an embodiment, there is provided a nanogenerator including at least one nanostructure including an organic piezoelectric material.

The organic piezoelectric material may be a ferroelectric material.

The organic piezoelectric material may be polyvinylidene fluoride (PVDF).

The nanogenerator may further include a substrate, and a first electrode disposed apart from the substrate. The least one nanostructure may be disposed between the substrate and the first electrode.

The substrate may include a conductive material.

The nanogenerator may further include a second electrode on the substrate.

The at least one nanostructure may be disposed perpendicularly or inclined at a predetermined angle with respect to the substrate.

A stack structure of the at least one nanostructure and a third electrode on the at least one nanostructure may be formed at least once on the first electrode.

The nanogenerator may further include a plurality of electrodes disposed apart from one another, and the least one nanostructure may be disposed between the plurality of electrodes.

The plurality of electrodes and the at least one nanostructure may be disposed on the substrate.

The plurality of electrodes may be disposed in parallel at predetermined intervals.

The at least one nanostructure may be disposed perpendicularly or inclined at a predetermined angle with respect to the plurality of electrodes.

The plurality of electrodes may be connected in series.

According to an aspect of another embodiment, a method of manufacturing a nanogenerator includes forming at least one nanostructure including an organic piezoelectric material on a substrate.

The organic piezoelectric material may be PVDF.

The method may further include forming a first electrode on the at least one nanostructure.

The method may further include forming a second electrode on the substrate.

The at least one nanostructure may be formed to be perpendicular or inclined at a predetermined angle with respect to the substrate.

The method may further include forming a stack structure of the at least one nanostructure and a third electrode on the at least one nanostructure, on the first electrode, at least once.

The method may further include forming a plurality of electrodes on the substrate to be parallel with one another at predetermined intervals.

The at least one nanostructure may be formed between the plurality of electrodes.

The forming of the at least one nanostructure may include forming an anodic metal oxide template including a metal layer and a porous layer on the metal layer; filling the porous layer with a solution containing the organic piezoelectric material; forming the at least one nanostructure by poling the organic piezoelectric material; and removing the anodic metal oxide template.

The solution is filled in the porous layer when a temperature of the solution is at about 50° C. to about 250° C.

The organic piezoelectric material may be poled when a temperature of the organic piezoelectric material is at about 50° C. to about 250° C.

The method may further include removing a thin film on the porous layer by using the solution.

The forming of the at least one nanostructure may include forming an anodic metal oxide template including a metal layer and a porous layer on the metal layer; removing the metal layer from the anodic metal oxide template; filling the porous layer with a solution containing the organic piezoelectric material; forming the at least one nanostructure by poling the organic piezoelectric material; and removing the porous layer.

BRIEF DESCRIPTION OF THE DRAWINGS

The above and/or other aspects will become apparent and more readily appreciated from the following description of the embodiments, taken in conjunction with the accompanying drawings of which.

DETAILED DESCRIPTION

Figure 1A:
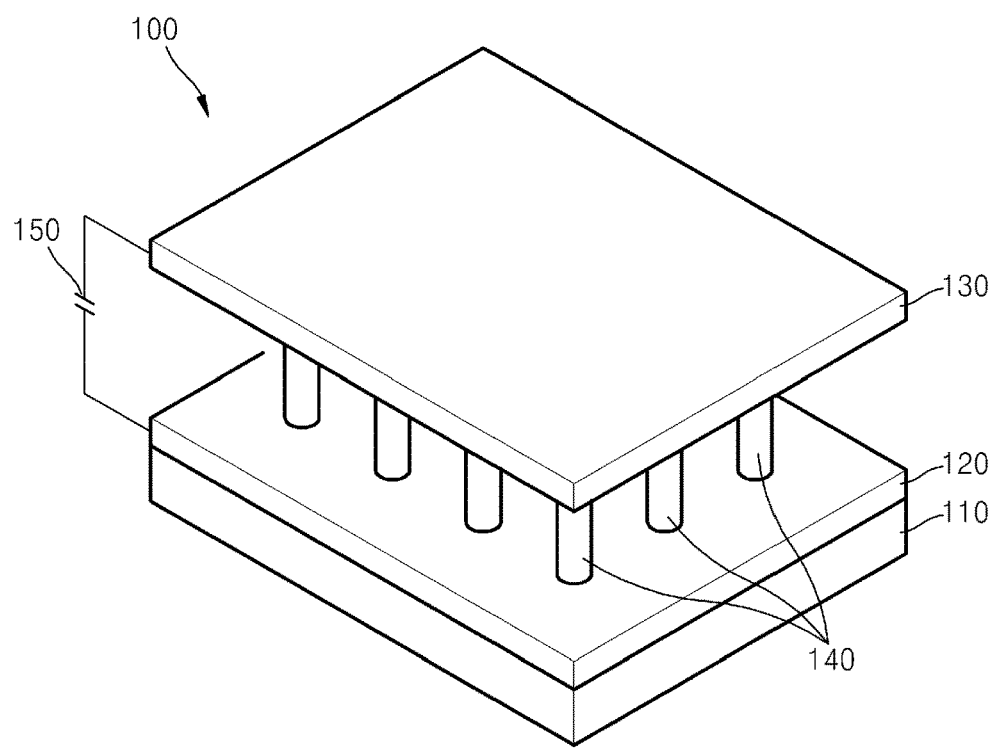
FIG. 1A is a schematic perspective view of a nanogenerator according to an embodiment.

Various exemplary embodiments will now be described more fully with reference to the accompanying drawings in which some exemplary embodiments are shown.

Detailed illustrative exemplary embodiments are disclosed herein. However, the specific structural and functional details disclosed herein are merely representative, and the present disclosure should not be construed as limited to only the exemplary embodiments set forth herein.

Accordingly, while example embodiments are capable of various modifications and alternative forms, embodiments thereof are shown by way of example in the drawings and will herein be described in detail. It should be understood, however, that there is no intent to limit exemplary embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the exemplary embodiments. As used herein, the term "and/or," includes any and all combinations of one or more of the listed items.

It will be understood that when an element or layer is referred to herein as being "formed on," another element or layer, it may be directly or indirectly formed on the other element or layer. For example, intervening elements or layers may be present. In contrast, when an element or layer is referred to herein as being "directly formed on," to another element, there are no intervening elements or layers present. Other words used to describe the relationship between elements or layers are to be interpreted in a like fashion (e.g., "between," versus "directly between," "adjacent," versus "directly adjacent," etc.).

The terminology used herein is for the purpose of describing particular embodiments only and is not intended to be limiting of exemplary embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the drawings, the thicknesses of layers and regions may be exaggerated for clarity. Like reference numerals in the drawings denote like elements.

Hereinafter, nanogenerators and methods of manufacturing the same according to various embodiments will be described in detail with reference to the accompanying drawings.

Figure 1B:
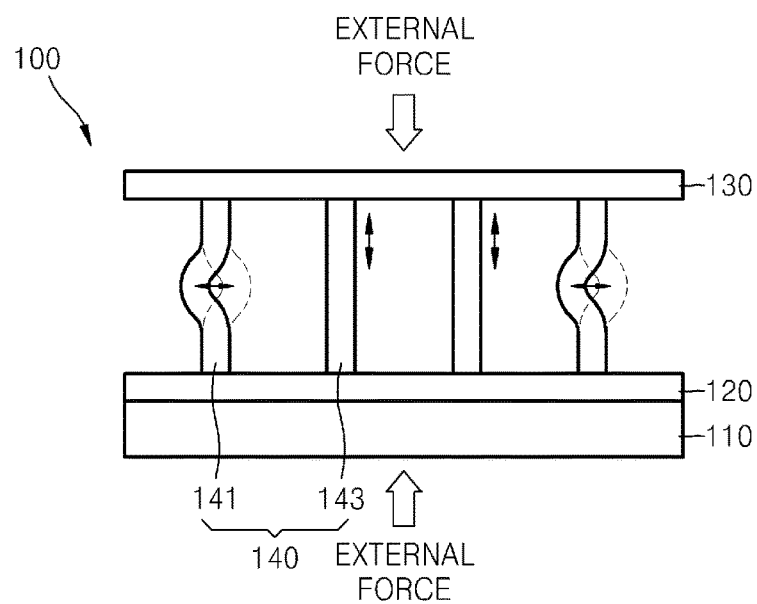
FIG. 1B is a schematic front sectional view of the nanogenerator of FIG. 1A.

FIG. 1A is a schematic perspective view of a nanogenerator 100 according to an embodiment. FIG. 1B is a schematic front sectional view of the nanogenerator 100 of FIG. 1A.

Referring to FIGS. 1A and 1B, the nanogenerator 100 may include a substrate 110, a first electrode 130 disposed apart from the substrate 110 by a predetermined distance, and at least one nanostructure 140 disposed between the substrate 110 and the first electrode 130. The nanogenerator 100 may further include a second electrode 120 disposed on the substrate 110. The at least one nanostructure 140 may be disposed between the first and second electrodes 130 and 120.

Any of various types of substrates may be used as the substrate 110. For example, the substrate 110 may be a solid substrate, such as a glass substrate or a silicon substrate, or a flexible substrate, such as a plastic substrate or a textile substrate, but aspects of the present invention are not limited thereto.

The first electrode 130 may be disposed apart from the substrate 110 by a predetermined distance, and the second electrode 120 may be further disposed on the substrate 110. Each of the first electrode 130 and the second electrode 120 may be formed of a material selected from the group consisting of gold (Au), silver (Ag), aluminum (Al), copper (Cu), palladium (Pd), platinum (Pt), ruthenium (Ru), or mixtures thereof. In other embodiments, each of the first electrode 130 and the second electrode 120 may be formed of an indium tin oxide (ITO), a carbon nanotube, a conductive polymer, nanofiber, a nanocomposite, or graphene. However, the materials of the electrodes are not limited thereto. When the substrate 110 contains a conductive material, the substrate 110 may be used as an electrode instead of the second electrode 120. For example, if the substrate 110 contains high-concentration doped silicon, the second electrode 120 may not be formed on the substrate 110.

At least one nanostructure 140 may be disposed between the first electrode 130 and the second electrode 120. The at least one nanostructure 140 may be formed on the second electrode 120 in an m×n 2D array. Here, m and n each denote a natural number. In other words, one nanostructure 140 may be disposed on the second electrode 120 or a plurality of nanostructures 140 may be disposed in parallel on the second electrode 120 to be apart from one another by a predetermined distance. Also, the at least one nanostructure 140 may be disposed perpendicularly or inclined at a predetermined angle with respect to the substrate 110.

The at least one nanostructure 140 may include an organic piezoelectric material, e.g., a ferroelectric material. For example, the at least one nanostructure 140 may include polyvinylidene fluoride (PVDF). More specifically, the at least one nanostructure 140 may include β-phase PVDF. If the at least one nanostructure 140 includes PVDF, the at least one nanostructure 140 may be formed using an anodic aluminum oxide template. The at least one nanostructure 140 may include a nanorod, a nanowire, or a nanotube. The nanorod and the nanowire may have different aspect ratios. For example, the aspect ratio of the nanowire may be greater or less than that of the nanorod. The size and sectional shape of the at least one nanostructure 140 may vary according to those of the anodic aluminum oxide template.

An external load 150 may be connected to the first and second electrodes 130 and 120 to store electricity generated by the nanogenerator 100 or to consume the electricity. For example, if the external load 150 is a capacitor, the electricity generated by the nanogenerator 100 may be stored in the capacitor. If the external load 150 is a nano device, the electricity generated by the nanogenerator 100 may be consumed by the nano device.

A mechanical force, e.g., fine vibrations, wind, sound, or a motion of a human body, may be externally applied to the nanogenerator 100. In such a case, the at least one nanostructure 140 on the substrate 110 may be deformed. Referring to FIG. 1B, a portion 141 of at least one nanostructure 140 may bend flexibly, and another portion 143 may contract in a lengthwise direction when the mechanical force is applied to the at least one nanostructure 140. When the application of the mechanical force ends, the at least one nanostructure 140 returns back to the original state. Since the at least one nanostructure 140 has piezoelectric characteristics, the at least one nanostructure 140 may induce a voltage between the first and second electrodes 130 and 120 connected to both ends of the at least one nanostructure 140. Thus, the nanogenerator 100 may convert mechanical energy into electric energy.

The nanogenerator 100 includes the at least one nanostructure 140 with organic piezoelectric material having good piezoelectric characteristics, and may thus effectively convert mechanical energy generated from, for example, fine vibrations or motion to electric energy. The at least one nanostructure 140 including PVDF has better piezoelectric characteristics than a ZnO nanostructure. In addition, a piezoelectric material, such as lead zirconate titanate (PZT), contains lead (Pb), and is therefore harmful to human bodies. Also, forming a nanostructure using PZT is difficult. On the other hand, since the at least one nanostructure 140 including PVDF is chemically stable, and is not harmful to human bodies, it may thus be applied to human bodies. Also, the at least one nanostructure 140 including PVDF is flexible and may therefore be used to manufacture a flexible nano device. When nano devices are driven by using the nanogenerator 100, the sizes of the nano devices may be minimized and the performances of the nano devices may be enhanced. Furthermore, the nano devices may be independently driven.

Figure 2A:
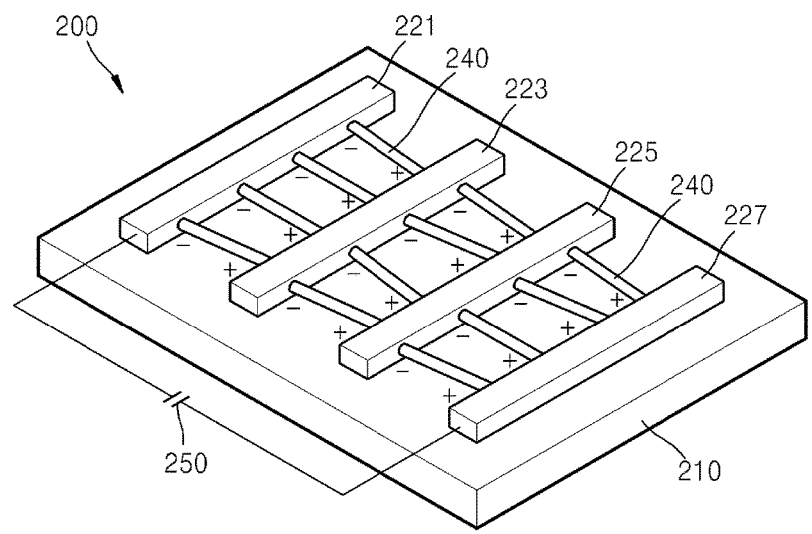
FIG. 2A is a schematic perspective view of a nanogenerator according to another embodiment.
Figure 2B:
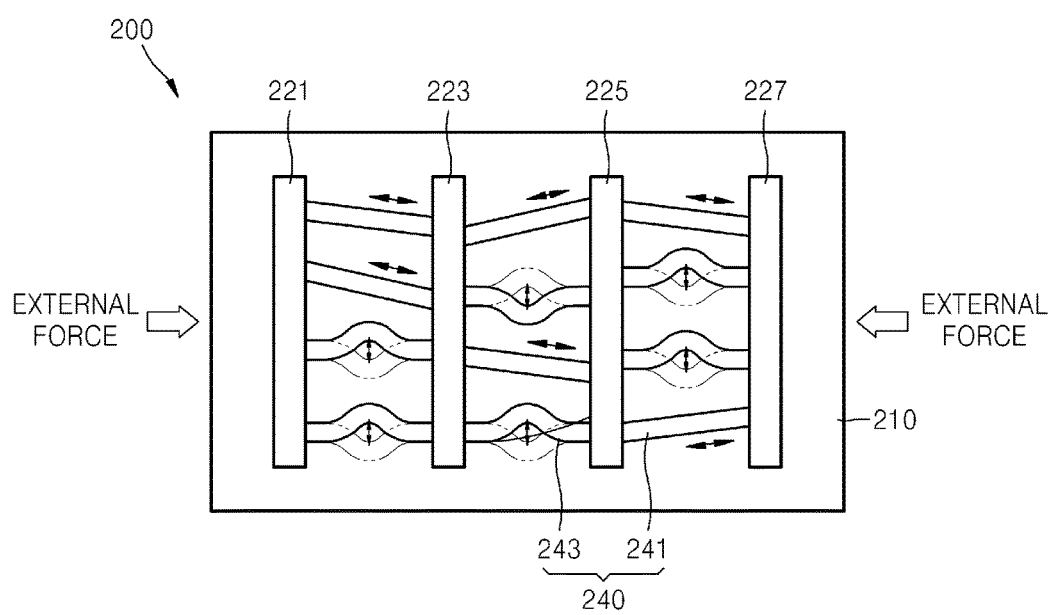
FIG. 2B is a schematic top plan view of the nanogenerator of FIG. 2A.

FIG. 2A is a schematic perspective view of a nanogenerator 200 according to another embodiment. FIG. 2B is a schematic top plan view of the nanogenerator 200 of FIG. 2A.

Referring to FIGS. 2A and 2B, the nanogenerator 200 may include a substrate 210, a plurality of electrodes 221, 223, 225, and 227 disposed apart from one another on the substrate 210, and at least one nanostructure 240 disposed between the plurality of electrodes 221, 223, 225, and 227.

Any of various types of substrates may be used as the substrate 210. For example, the substrate 210 may be a solid substrate, such as a glass substrate or a silicon substrate, or a flexible substrate, such as a plastic substrate or a textile substrate, but aspects of the present invention are not limited thereto.

The plurality of electrodes 221, 223, 225, and 227 may be disposed apart from one another on the substrate 210. The plurality of electrodes 221, 223, 225, and 227 may be disposed in parallel on the substrate 210 at predetermined intervals. Each of the plurality of electrodes 221, 223, 225, and 227 may be formed of a material selected from the group consisting of gold (Au), silver (Ag), aluminum (Al), copper (Cu), palladium (Pd), platinum (Pt), ruthenium (Ru), and mixtures thereof. In other embodiments, each of plurality of electrodes 221, 223, 225, and 227 may be formed of an indium tin oxide (ITO), a carbon nanotube, a conductive polymer, nanofiber, a nanocomposite, or graphene. However, the materials of the electrodes are not limited thereto. The at least one nanostructure 240 may be disposed between the plurality of electrodes 221, 223, 225, and 227. The at least one nanostructure 240 may be disposed perpendicularly or inclined at a predetermined angle with respect to the plurality of electrodes 221, 223, 225, and 227. Also, the at least one nanostructure 240 may be respectively disposed inclined at a random angle with respect to the plurality of electrodes 221, 223, 225, and 227. The plurality of electrodes 221, 223, 225, and 227 may be connected in series via the at least one nanostructure 240 disposed between the plurality of electrodes 221, 223, 225, and 227. A higher voltage may be obtained when the plurality of electrodes 221, 223, 225, and 227 are connected in series than when the plurality of electrodes 221, 223, 225, and 227 are not connected in series.

An external load 250 may be connected to the outermost electrodes 221 and 227 from among the plurality of electrodes 221, 223, 225, and 227 so as to store or consume electricity generated by the nanogenerator 200. FIGS. 2A and 2B illustrate a case where four electrodes 221, 223, 225, and 227 are disposed on the substrate 210, but embodiments are not limited thereto and at least two electrodes may be disposed on the substrate 210.

The at least one nanostructure 240 may include an organic piezoelectric material, e.g., a ferroelectric material. For example, the at least one nanostructure 240 may include polyvinylidene fluoride (PVDF). More specifically, the at least one nanostructure 240 may include β-phase PVDF. If the at least one nanostructure 240 includes PVDF, the at least one nanostructure 240 may be formed using an anodic aluminum oxide template. The at least one nanostructure 240 may include a nanorod, a nanowire, or a nanotube. The nanorod and the nanowire may have different aspect ratios. For example, the aspect ratio of the nanowire may be greater or less than that of the nanorod. The size and cross-sectional shape of the at least one nanostructure 240 may vary according to those of the anodic aluminum oxide template.

A mechanical force, e.g., fine vibrations, wind, sound, or the motion of a human body, may be externally applied to the nanogenerator 200. In such a case, the at least one nanostructure 240 on the substrate 210 may be deformed. Referring to FIG. 2B, a portion 243 of the at least one nanostructure 240 may bend flexibly, and another portion 241 may contract in a lengthwise direction when the mechanical force is applied to the at least one nanostructure 240. When the application of the mechanical force ends, the at least one nanostructure 240 returns back to the original state. Since the at least one nanostructure 240 has such piezoelectric characteristics, the at least one nanostructure 240 may induce a voltage between the plurality of electrodes 221, 223, 225, and 227 connected to the at least one nanostructure 240. Thus, the nanogenerator 200 may convert mechanical energy into electric energy. Although FIG. 2B illustrates a case where an external force is applied in a direction parallel to the substrate 210, embodiments are not limited thereto and the external force may be applied in a direction other than parallel to the substrate, e.g., perpendicular to the substrate 210. In this case, the at least one nanostructure 240 may flexible bend in the direction perpendicularly to the substrate 210.

In the nanogenerator 200, a low voltage may be generated between adjacent every two electrodes from among the plurality of electrodes 221, 223, 225, and 227. However, since all of the plurality of electrodes 221, 223, 225, and 227 are connected in series, a higher voltage may be obtained in the nanogenerator 200 by increasing the total number of electrodes therein.

The nanogenerator 200 includes the at least one nanostructure 240 with organic piezoelectric material having good piezoelectric characteristics, and may thus effectively convert mechanical energy generated from, for example, fine vibrations or motion to electric energy. The at least one nanostructure 240 including PVDF has better piezoelectric characteristics than a ZnO nanostructure. A piezoelectric material, such as lead zirconate titanate (PZT), contains lead (Pb), and is therefore harmful to human bodies. Also, forming a nanostructure by using PZT is difficult. On the other hand, since the at least one nanostructure 240 including PVDF is chemically stable, and is not harmful to human bodies, it may therefore be applied to human bodies. Also, the at least one nanostructure 240 including PVDF is flexible and may therefore be used to manufacture a flexible nano device. When nano devices are driven by using the nanogenerator 200, the sizes of the nano devices may be minimized and the performances of the nano devices may be enhanced. Furthermore, the nano devices may be independently driven.

Methods of manufacturing a nanogenerator according to exemplary embodiments are described below.

Figure 3A:
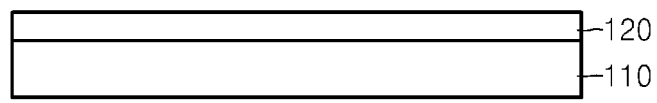
FIGS. 3A to 3C are schematic cross-sectional views sequentially illustrating a method of manufacturing a nanogenerator, according to an embodiment.
Figure 3B:
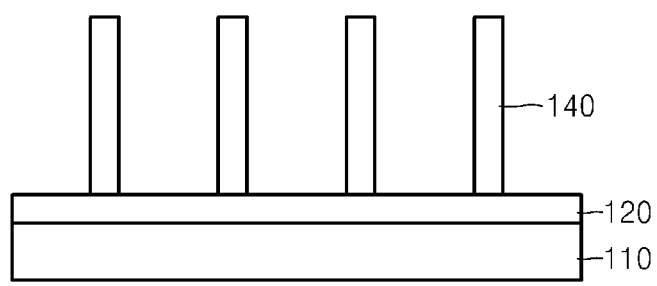
Figure 3C:
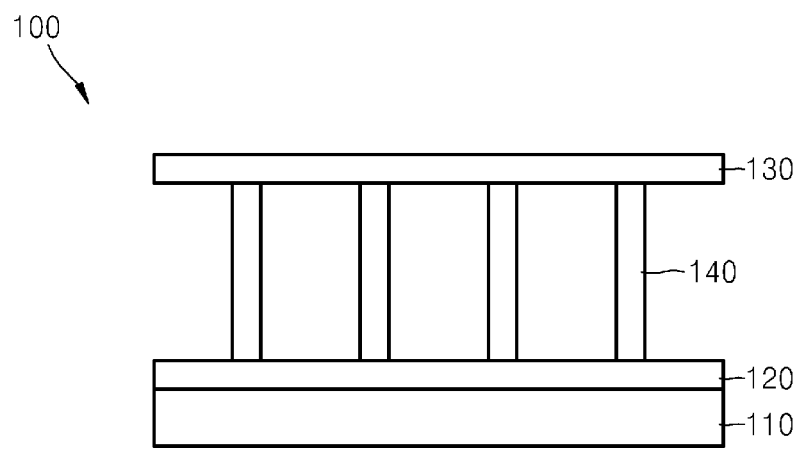

FIGS. 3A to 3C are schematic cross-sectional views sequentially illustrating a method of manufacturing the nanogenerator 100 illustrated in FIGS. 1A and 1B, according to an embodiment. Referring to FIG. 3A, the substrate 110 may be prepared, and the second electrode 120 may be formed on the substrate 110. Any of the previously mentioned various types of substrates may be used as the substrate 110. For example, the substrate 110 may be a solid substrate, such as a glass substrate or a silicon substrate, or a flexible substrate, such as a plastic substrate or a textile substrate, but the materials of the substrate are not limited thereto.

The second electrode 120 may be formed of a material selected from the group consisting of gold (Au), silver (Ag), aluminum (Al), copper (Cu), palladium (Pd), platinum (Pt), ruthenium (Ru), and mixtures thereof. In other embodiments, each of the first electrode 130 and the second electrode 120 may be formed of an indium tin oxide (ITO), a carbon nanotube, a conductive polymer, nanofiber, a nanocomposite, or graphene. However, the materials of the electrodes are not limited thereto. When the substrate 110 contains a conductive material, the substrate 110 may be used as an electrode instead of the second electrode 120, and the second electrode 120 may thus not be formed on the substrate 110.

Referring to FIG. 3B, at least one nanostructure 140 may be formed on the second electrode 120. The at least one nanostructure 140 may be formed on the second electrode 120 in an m×n 2D array. Here, m and n each denote a natural number. In other words, one nanostructure 140 may be formed on the second electrode 120 or a plurality of nanostructures 140 may be formed in parallel on the second electrode 120 to be apart from one another by a predetermined distance. Also, the at least one nanostructure 140 may be disposed perpendicularly or inclined at a predetermined angle with respect to the substrate 110.

The at least one nanostructure 140 may include an organic piezoelectric material, e.g., a ferroelectric material. For example, the at least one nanostructure 140 may include polyvinylidene fluoride (PVDF). In such a case, the at least one nanostructure 140 may be formed using an anodic aluminum oxide template. The at least one nanostructure 140 may include a nanorod, a nanowire, or a nanotube. The nanorod and the nanowire may have different aspect ratios. For example, the aspect ratio of the nanowire may be greater or less than that of the nanorod. The size and sectional shape of the at least one nanostructure 140 may vary according to those of the anodic aluminum oxide template. A method of forming the at least one nanostructure 140 will be described in detail with reference to FIGS. 4A to 4D or FIGS. 5A to 5E below.

Referring to FIG. 3C, the first electrode 130 may be formed on the at least one nanostructure 140. The first electrode 130 may be disposed apart from the substrate 110 by a predetermined distance. The first electrode 130 may be formed of a material selected from the group consisting of gold (Au), silver (Ag), aluminum (Al), copper (Cu), palladium (Pd), platinum (Pt), ruthenium (Ru), and mixtures thereof. In other embodiments, the first electrode 130 may be formed of an indium tin oxide (ITO), a carbon nanotube, a conductive polymer, nanofiber, a nanocomposite, or graphene. However, the materials of the electrodes are not limited thereto. A stack structure of the at least one nanostructure 140 and a third electrode 131 of FIG. 7 on the at least one nanostructure 140 may further be formed at least once on the first electrode 130. For example, referring to FIG. 7, the third electrode 131 is further formed to be apart from the first electrode 130 by a predetermined distance, and the at least one nanostructure 140 may further be formed between the first and third electrodes 130 and 131. Then, a fourth electrode 132 may further be formed to be apart from the third electrode 131 by a predetermined distance, and the at least one nanostructure 140 may further be formed between the third and fourth electrodes 131 and 132.

Figure 4A:
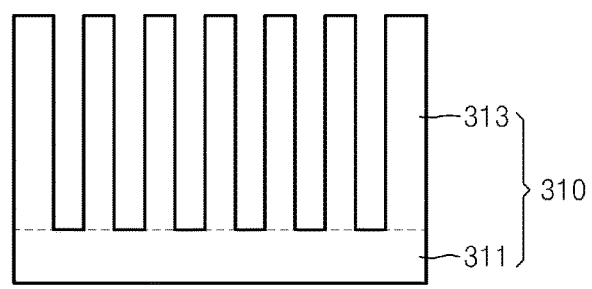
FIGS. 4A to 4D are schematic cross-sectional views sequentially illustrating a method of manufacturing a nanostructure included in a nanogenerator, according to an embodiment.

FIGS. 4A to 4D are schematic cross-sectional views sequentially illustrating a method of manufacturing the at least one nanostructure 140 of FIGS. 1A and 1B, according to an embodiment. Referring to FIG. 4A, first, an anodic metal oxide template 310 may be prepared. The anodic metal oxide template 310 may include a metal layer 311 and a porous layer 313 on the metal layer 311. The anodic metal oxide template 310 may be, for example, an anodic aluminum oxide (AAO) template. As an example, the anodic aluminum oxide template may be obtained by performing at least one anodic oxidation process on aluminum foil. In the anodic oxidation process, the aluminum foil may be dipped into an oxalic acid solution or a sulfuric acid solution at about 15° C. and a voltage of about 40V may be applied thereto to obtain a porous anodic aluminum oxide template. Then, the porous anodic aluminum oxide template may be etched using a phosphoric acid solution to adjust the size and depth of each hole therein. As an example, if the porous anodic aluminum oxide template is formed having deep holes, by increasing the etch time, then the porous anodic aluminum oxide template may provide for a nanowire rather than a nanorod.

Figure 4B:
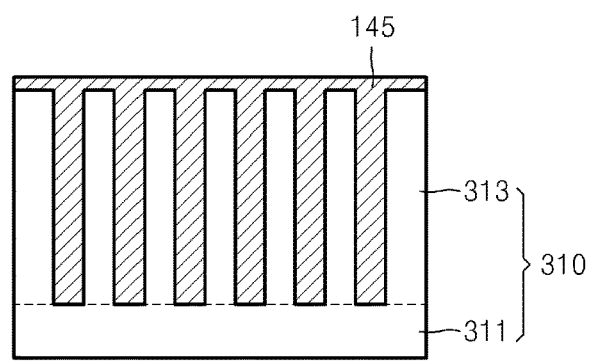

Referring to FIG. 4B, a solution 145 containing an organic piezoelectric material may be filled into the anodic metal oxide template 310. The organic piezoelectric material may be a ferroelectric material, e.g., PVDF. More specifically, the organic piezoelectric material may include β-phase PVDF. The solution 145 may be obtained by dissolving the organic piezoelectric material using a solvent, such as butanol or dimethylformamide (DMF) or another solvent suitable for dissolving the organic piezoelectric material. The solution 145 may be filled into holes formed in the porous layer 313 in any suitable manner. For example, in order to fill the porous layer 313 with the solution 145, the solution 145 may be sprayed onto the porous layer 313 or the anodic metal oxide template 310 may be dipped into the solution 145. The porous layer 313 may be easily filled with the solution 145 when the temperature of the solution is at about 50 ☐ to about 250 ☐. For example, the porous layer 313 may be filled with the solution 145 containing the organic piezoelectric material when the temperature of the solution is at about 150 ☐. In other embodiments, the porous layer 313 may be filled with the solution 145 in a vacuum. Nanowires (nanorods) or nanotubes with the organic piezoelectric material may be formed by adjusting the weight percentage (wt %) of the organic piezoelectric material in the solution 145. For example, if the weight percentage (wt %) of the organic piezoelectric material is high, it is possible to form nanowires (nanorods) using the organic piezoelectric material. In other embodiments, it is possible to form nanowires (nanorods) with the organic piezoelectric material by repeatedly filling the solution 145 in the porous layer 313.

Figure 4C:
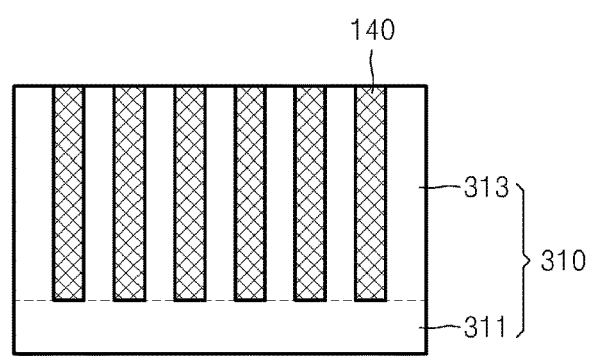

Referring to FIG. 4C, poling, that is, recrystallization, may be performed on the organic piezoelectric material filled in the porous layer 313 to form the nanostructure 140. The organic piezoelectric material may be poled when the temperature of the organic piezoelectric material is at about 50° C. to about 250° C. For example, the organic piezoelectric material may be poled when the temperature of the organic piezoelectric material is at about 150° C. In some embodiments, a thin film formed on the porous layer 313 with the solution 145 containing the organic piezoelectric material may be removed. The thin film may be removed, for example, by performing an oxygen plasma process.

Figure 4D:
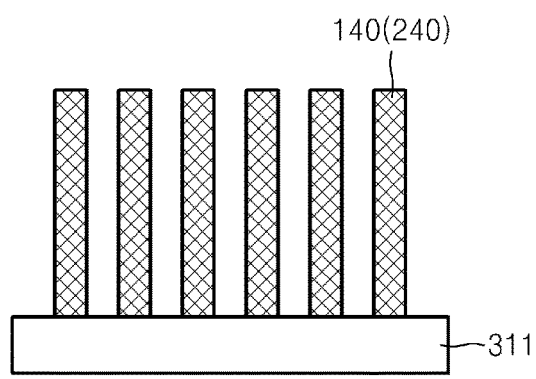

Referring to FIG. 4D, the porous layer 313 may be removed. The manner of removing porous layer 313 is not particularly limited. The porous layer 313 may be removed, for example, by a wet etching process using a NaOH solution. Using such a process, the at least one nanostructure 140 may be formed on the metal layer 311. In some embodiments, the metal layer 311 may be used as the second electrode 120 included in the nanogenerator 100 of FIGS. 1A and 1B. Alternatively, the metal layer 311 may be removed together with the porous layer 313. Similarly, the nanostructure 240 illustrated in FIGS. 2A and 2B may be formed.

Figure 5A:
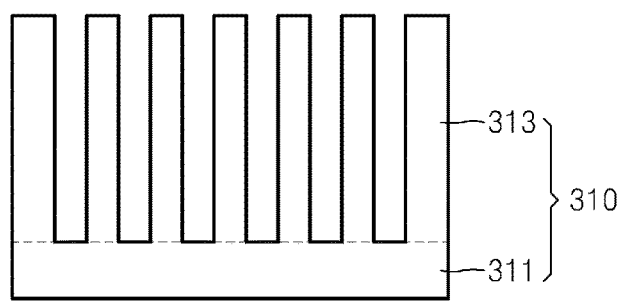
FIGS. 5A to 5E are schematic cross-sectional views sequentially illustrating a method of manufacturing a nanostructure included in a nanogenerator, according to another embodiment.

FIGS. 5A to 5E are schematic cross-sectional views sequentially illustrating a method of manufacturing the at least one nanostructure 140 included in the nanogenerator 100 of FIGS. 1A and 1B, according to another embodiment. Referring to FIG. 5A, first, the anodic metal oxide template 310 may be prepared. The anodic metal oxide template 310 may include a metal layer 311 and a porous layer 313 on the metal layer 311. The anodic metal oxide template 310 may be, for example, an anodic aluminum oxide (AAO) template. In one embodiment, the anodic aluminum oxide template may be obtained by performing at least one anodic oxidation process on aluminum foil. In the anodic oxidation process, the aluminum foil may be dipped into an oxalic acid solution or a sulfuric acid solution at about 15° C. and a voltage of about 40V may be applied thereto to obtain a porous anodic aluminum oxide template. Then, the porous anodic aluminum oxide template may be etched using, for example, a phosphoric acid solution to adjust the size and depth of each hole therein.

Figure 5B:
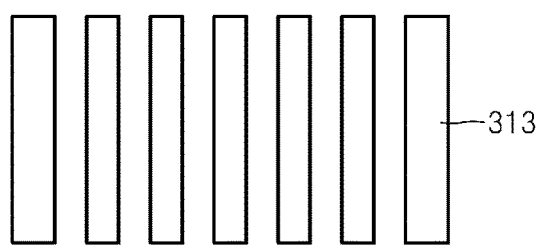

Referring to FIG. 5B, the metal layer 311 may be removed from the anodic metal oxide template 310 so that only the porous layer 313 may remain in the anodic metal oxide template 310. The manner of removing the metal layer 311 is not particularly limited. For example, the metal layer 311 may be removed by a wet etching process using, for example, a NaOH solution.

Figure 5C:
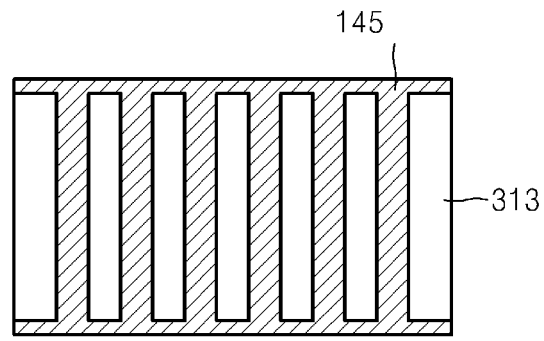

Referring to FIG. 5C, a solution 145 containing an organic piezoelectric material may be filled in the remaining porous layer 313 using any suitable method. The organic piezoelectric material may be a ferroelectric material, e.g., PVDF. More specifically, the organic piezoelectric material may include β-phase PVDF. The solution 145 may be obtained by dissolving the organic piezoelectric material in any suitable solvent, e.g., butanol or dimethylformamide (DMF). The solution 145 may be filled in holes formed in the porous layer 313 in any suitable manner. For example, order to fill the porous layer 313 with the solution 145, the solution 145 may be sprayed onto the porous layer 313 or the anodic metal oxide template 310 may be dipped into the solution 145. Since the holes in the porous layer 311 are through holes, that is, both ends of the holes of the porous layer 311 are open, the solution 145 may be easily and rapidly entered into the holes. The porous layer 313 may be easily filled with the solution when the temperature of the solution is 145 at about 50° C. to about 250° C. For example, the porous layer 313 may be filled with the solution 145 containing the organic piezoelectric material when the temperature of the solution is at about 150° C. In another embodiment, the porous layer 313 may be filled with the solution 145 in a vacuum. It is possible to form nanowires (or nanorods) or nanotubes with the organic piezoelectric material by adjusting the weight percentage (wt %) of the organic piezoelectric material in the solution 145. For example, if the weight percentage (wt %) of the organic piezoelectric material is low, it is possible to form nanotubes by using the organic piezoelectric material.

Figure 5D:
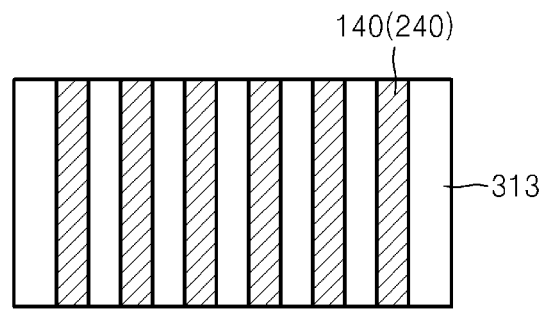

Referring to FIG. 5D, poling may be performed on the organic piezoelectric material filled in the porous layer 313 to form the nanostructure 140. The organic piezoelectric material may be poled when the temperature of the organic piezoelectric material is at about 50° C. to about 250° C. For example, the organic piezoelectric material may be poled when the temperature of the organic piezoelectric material is at about 150° C. In some embodiments, a thin film formed on the porous layer 313 with the solution 145 containing the organic piezoelectric material may be removed. The thin film may be removed, for example, by performing an oxygen plasma process.

Figure 5E:
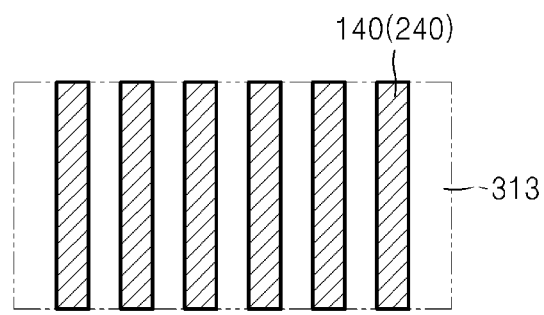

Referring to FIG. 5E, the porous layer 313 may be removed by any suitable manner. The porous layer 313 may be removed by a wet etching process, for example, using a NaOH solution, thereby forming the at least one nanostructure 140. Similarly, the nanostructure 240 illustrated in FIGS. 2A and 2B may be formed.

Figure 6A:
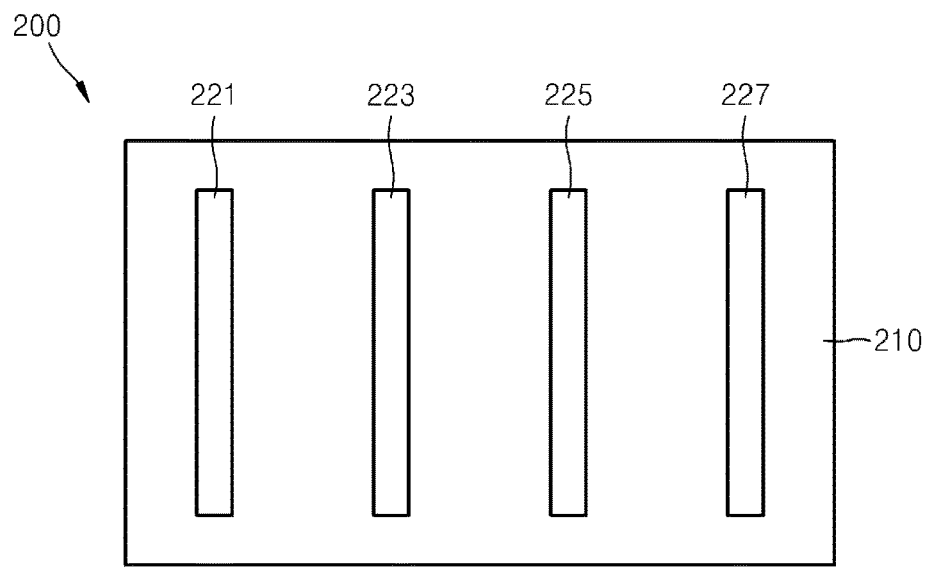
FIGS. 6A and 6B are schematic cross-sectional views sequentially illustrating a method of manufacturing a nanogenerator, according to another embodiment.
Figure 6B:
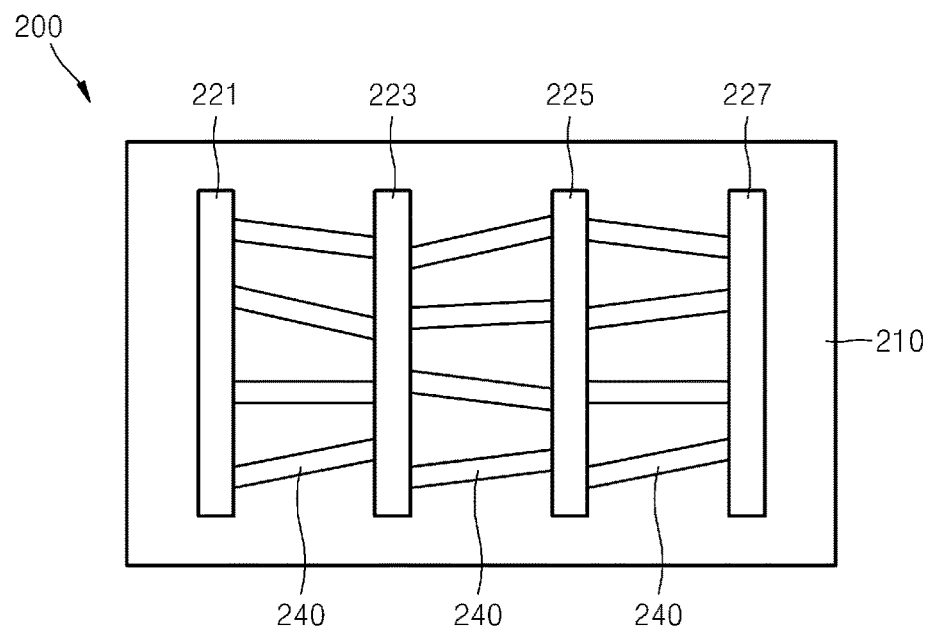

FIGS. 6A and 6B are schematic cross-sectional views sequentially illustrating a method of manufacturing the nanogenerator 200 of FIGS. 2A and 2B, according to another embodiment. Referring to FIG. 6A, the plurality of electrodes 221, 223, 225, and 227 may be formed on the substrate 210. Any of the previously disclosed various types of substrates may be used as the substrate 210. For example, the substrate 210 may be a solid substrate, such as a glass substrate or a silicon substrate, or a flexible substrate, such as a plastic substrate or a textile substrate, but aspects of the present invention are not limited thereto.

The plurality of electrodes 221, 223, 225, and 227 may be disposed in parallel on the substrate 210 at predetermined intervals. Each of the plurality of electrodes 221, 223, 225, and 227 may be formed of a material selected from the group consisting of gold (Au), silver (Ag), aluminum (Al), copper (Cu), palladium (Pd), platinum (Pt), ruthenium (Ru), and mixtures thereof. In other embodiments, each of plurality of electrodes 221, 223, 225, and 227 may be formed of an indium tin oxide (ITO), a carbon nanotube, a conductive polymer, nanofiber, a nanocomposite, or graphene. However, the materials of the electrodes are not limited thereto.

Referring to FIG. 6B, the at least one nanostructure 240 may be disposed between the plurality of electrodes 221, 223, 225, and 227. The at least one nanostructure 240 may be disposed perpendicularly or inclined at a predetermined angle with respect to the plurality of electrodes 221, 223, 225, and 227. Also, the at least one nanostructure 240 may be respectively disposed inclined at a random angle with respect to the plurality of electrodes 221, 223, 225, and 227.

The at least one nanostructure 240 may include an organic piezoelectric material, e.g., a ferroelectric material. For example, the at least one nanostructure 240 may include polyvinylidene fluoride (PVDF). More specifically, the at least one nanostructure 140 may include β-phase PVDF. If the at least one nanostructure 240 includes PVDF, the at least one nanostructure 240 may be formed using an anodic aluminum oxide template. The at least one nanostructure 240 may include a nanorod, a nanowire, or a nanotube. The nanorod and the nanowire may have different aspect ratios. For example, the aspect ratio of the nanowire may be greater than or less than that of the nanorod. The size and sectional shape of the at least one nanostructure 240 may vary according to those of the anodic aluminum oxide template. A method of forming the at least one nanostructure 240 is as described above with reference to FIGS. 4A to 4D or FIGS. 5A to 5E.

Figure 7:
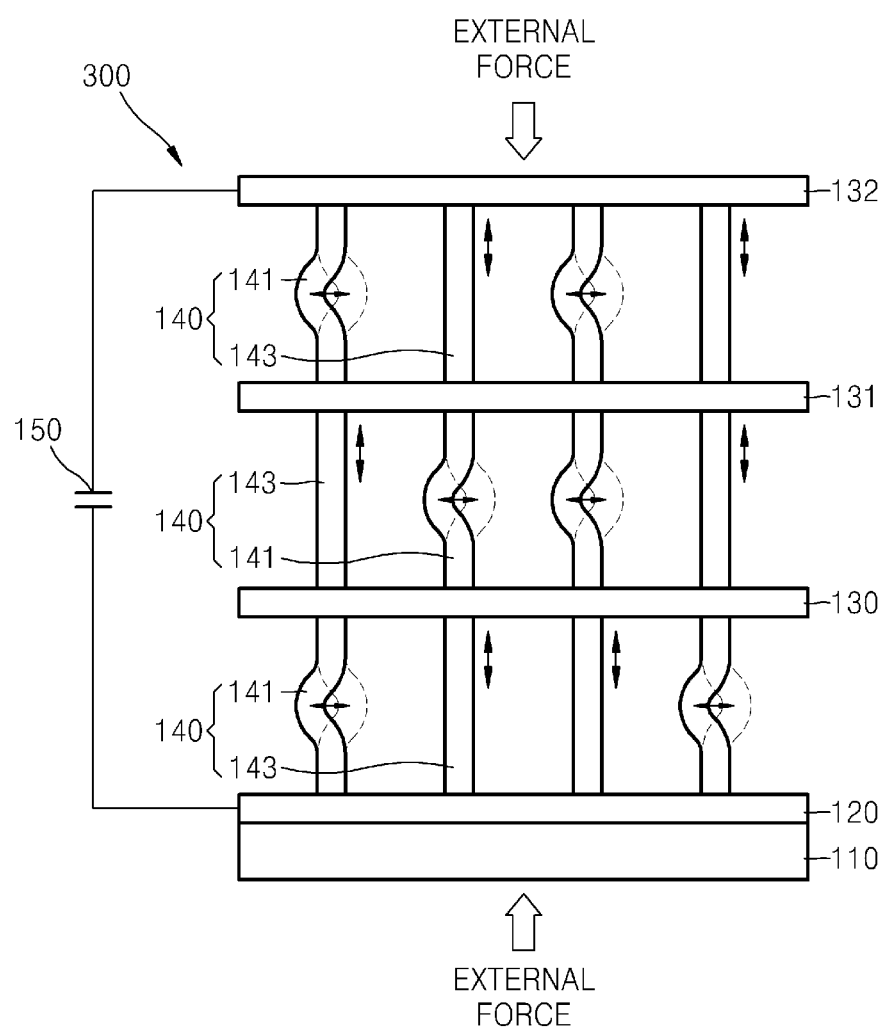
FIG. 7 is a schematic cross-sectional view of a nanogenerator according to another embodiment.

FIG. 7 is a schematic cross-sectional view of a nanogenerator 300 according to another embodiment. Referring to FIG. 7, the nanogenerator 300 may include a substrate 110, a first electrode 130 disposed apart from the substrate 110 by a predetermined distance, and at least one nanostructure 140 disposed between the substrate 110 and the first electrode 130. In the nanogenerator 300, a stack structure of the at least one nanostructure 140 and a third electrode 131 on the at least one nanostructure 140 may be formed at least once on the first electrode 130. The nanogenerator 300 may further include a second electrode 120 on the substrate 110. The at least one nanostructure 140 may be disposed between the first and second electrodes 130 and 120 and between the first and third electrodes 130 and 131.

Any of the previously disclosed various types of substrates may be used as the substrate 110. For example, the substrate 110 may be a solid substrate, such as a glass substrate or a silicon substrate, or a flexible substrate, such as a plastic substrate or a textile substrate, but aspects of the present invention are not limited thereto.

The first electrode 130 may be disposed apart from the substrate 110 by the predetermined distance, and the second electrode 120 may be further disposed on the substrate 110. Each of the first electrode 130 and the second electrode 120 may be formed of a material selected from the group consisting of gold (Au), silver (Ag), aluminum (Al), copper (Cu), palladium (Pd), platinum (Pt), ruthenium (Ru), and mixtures thereof. In other embodiments, each of the first electrode 130 and the second electrode 120 may be formed of an indium tin oxide (ITO), a carbon nanotube, a conductive polymer, nanofiber, a nanocomposite, or graphene. However, the materials of the electrodes are not limited thereto. When the substrate 110 contains a conductive material, the substrate 110 may be used as an electrode instead of the second electrode 120. For example, if the substrate 110 contains high-concentration doped silicon, the second electrode 120 may not be formed on the substrate 110.

The at least one nanostructure 140 may be disposed between the first electrode 130 and the second electrode 120. The at least one nanostructure 140 may be formed on the second electrode 120 in an m×n 2D array. Here, m and n each denote a natural number. In other words, one nanostructure 140 may be disposed on the second electrode 120 or a plurality of nanostructures 140 may be disposed in parallel on the second electrode 120 to be apart from one another by a predetermined distance. Also, the at least one nanostructure 140 may be disposed perpendicularly or inclined at a predetermined angle with respect to the substrate 110.

A stack structure of the at least one nanostructure 140 and the third electrode 131 on the at least one nanostructure 140 may be formed at least once on first electrode 130. For example, referring to FIG. 7, the third electrode 131 may be disposed apart from the first electrode 130 by a predetermined distance, and the a fourth electrode 132 may be disposed apart from the third electrode 131 by a predetermined distance. In other words, the first to fourth electrodes 130, 120, 131, and 132 may be disposed to be parallel with one another, but the present embodiments are not limited thereto. The at least one nanostructure 140 may be also disposed between the first and third electrodes 130 and 131 and between the third and fourth electrodes 131 and 132. Each of the third and fourth electrodes 131 and 132 may be formed of a material selected from the group consisting of gold (Au), silver (Ag), aluminum (Al), copper (Cu), palladium (Pd), platinum (Pt), ruthenium (Ru), and mixtures thereof. In other embodiments, each of the third and fourth electrodes 131 and 132 may be formed of an indium tin oxide (ITO), a carbon nanotube, a conductive polymer, nanofiber, a nanocomposite, or graphene. However, the materials of the electrodes are not limited thereto.

The at least one nanostructure 140 may include an organic piezoelectric material, e.g., a ferroelectric material. For example, the at least one nanostructure 240 may include polyvinylidene fluoride (PVDF). More specifically, the at least one nanostructure 140 may include β-phase PVDF. If the at least one nanostructure 140 includes PVDF, the at least one nanostructure 140 may be formed using an anodic aluminum oxide template. The at least one nanostructure 140 may include a nanorod, a nanowire, or a nanotube. The nanorod and the nanowire may have different aspect ratios. For example, the aspect ratio of the nanowire may be greater than or less than that of the nanorod. The size and sectional shape of the at least one nanostructure 140 may vary according to those of the anodic aluminum oxide template.

An external load 150 may be connected to the outermost electrodes 120 and 132 from among the first to fourth electrodes 130, 120, 131, and 132 so as to store or consume electricity generated by the nanogenerator 300. For example, if the external load 150 is a capacitor, the electricity generated by the nanogenerator 300 may be stored in the capacitor. If the external load 150 is a nano device, the electricity generated by the nanogenerator 300 may be consumed by the nano device.

A mechanical force, e.g., fine vibrations, wind, sound, or the motion of a human body, may be externally applied to the nanogenerator 300. In such a case, the at least one nanostructure 140 on the substrate 110 may be deformed. Referring to FIG. 7, a portion 141 of the at least one nanostructure 140 may bend flexibly, and another portion 143 may contract in a lengthwise direction when the mechanical force is applied to the at least one nanostructure 140. When the application of the mechanical force ends, the at least one nanostructure 140 returns back to the original state. Since the at least one nanostructure 140 has piezoelectric characteristics, the at least one nanostructure 140 may induce a voltage between the first and second electrodes 130 and 120, between the first and third electrodes 130 and 131 and between the third and fourth electrodes 131 and 132 from among the first to fourth electrodes 130, 120, 131, and 132 connected to both ends of the at least one nanostructure 140. The first to fourth electrodes 130, 120, 131, and 132 may be connected in series via the at least one nanostructure 140 disposed therebetween. A higher voltage may be generated in the nanogenerator 300 when the first to fourth electrodes 130, 120, 131, and 132 are connected in series than when the first to fourth electrodes 130, 120, 131, and 132 are not connected in series.

It should be understood that the exemplary embodiments described therein should be considered in a descriptive sense only and not for purposes of limitation. Descriptions of features or aspects within each embodiment should typically be considered as available for other similar features or aspects in other embodiments.

What is claimed is:

1. A method of manufacturing a nanogenerator, the method comprising forming at least one nanostructure on a substrate, the at least one nanostructure comprising an organic piezoelectric material,
wherein the forming the at least one nanostructure comprises filling a porous layer of an anodic metal oxide template with a solution containing the organic piezoelectric material.

2. The method of claim 1, wherein the organic piezoelectric material is polyvinylidene fluoride.

3. The method of claim 1, further comprising forming a first electrode on the at least one nanostructure.

4. The method of claim 3, further comprising, prior to forming the at least one nanostructure, forming a second electrode on the substrate, wherein the at least one nanostructure is formed on the second electrode.

5. The method of claim 1, wherein the at least one nanostructure is formed to be perpendicularly or be inclined at a predetermined angle with respect to the substrate.

6. The method of claim 4, wherein the at least one nanostructure comprises at least a first nanostructure and a second nanostructure,
wherein the forming the at least one nanostructure further comprises forming the first nanostructure on the second electrode and forming the second nanostructure on the first electrode, and
the method further comprising forming a third electrode on the second nanostructure.

7. The method of claim 1, further comprising forming a plurality of electrodes on the substrate to be parallel with one another at predetermined intervals.

8. The method of claim 7, wherein the at least one nanostructure is formed between the plurality of electrodes.

9. The method of claim 1, wherein the forming the at least one nanostructure further comprises:
forming the anodic metal oxide template including a metal layer and the porous layer on the metal layer;
forming the at least one nanostructure by poling the organic piezoelectric material; and
removing the anodic metal oxide template.

10. The method of claim 9, wherein the solution is filled in the porous layer when a temperature of the solution is at about 50° C. to about 250° C.

11. The method of claim 9, wherein the organic piezoelectric material is poled when a temperature of the organic piezoelectric material is at about 50° C. to about 250° C.

12. The method of claim 9, further comprising removing a thin film on the porous layer by using the solution.

13. The method of claim 1, wherein the forming at least one nanostructure further comprises:
forming the anodic metal oxide template including a metal layer and the porous layer on the metal layer;
removing the metal layer from the anodic metal oxide template;
forming the at least one nanostructure by poling the organic piezoelectric material; and
removing the porous layer.

14. The method of claim 1, further comprising, prior to the forming at least one nanostructure, forming an electrode on the substrate, wherein the at least one nanostructure is formed on the electrode.

* * * * *